United States Patent [19]

Ullestad

[11] Patent Number: 4,908,623
[45] Date of Patent: Mar. 13, 1990

[54] APPARATUS AND METHOD FOR RANGE CONTROL AND SUPPLY VOLTAGE COMPENSATION IN A DUAL SLOPE ANALOG TO DIGITAL CONVERTER

[75] Inventor: David C. Ullestad, Albuquerque, N. Mex.

[73] Assignee: Honeywell Inc., Minneapolis, Minn.

[21] Appl. No.: 230,083

[22] Filed: Aug. 8, 1988

[51] Int. Cl.$^4$ .................................................. H03M 1/52
[52] U.S. Cl. ........................................ 341/167; 341/118; 341/128; 341/139
[58] Field of Search ............... 341/126, 127, 128, 129, 341/139, 166, 167, 168, 118, 119

[56] References Cited

U.S. PATENT DOCUMENTS

| | | | |
|---|---|---|---|
| 3,711,850 | 1/1973 | Kelly | 341/167 |
| 3,818,246 | 6/1974 | Hellworth et al. | 341/168 |
| 3,943,506 | 3/1976 | Peattie | 341/129 |
| 4,031,533 | 6/1977 | Neumann | 341/167 |
| 4,227,185 | 10/1980 | Kronlage | 341/167 |
| 4,339,958 | 7/1982 | Shauger | 341/128 |
| 4,445,111 | 4/1984 | Swift et al. | 341/128 |
| 4,484,177 | 11/1984 | Jobbagy | 341/167 |

Primary Examiner—William M. Shoop, Jr.
Assistant Examiner—Howard L. Williams
Attorney, Agent, or Firm—William W. Holloway; Clyde C. Blinn

[57] ABSTRACT

Apparatus for control of the range of input voltage values to be measured and for compensation of the changes in the supply voltage of an analog to digital dual slope converter circuit is described. The selection of a range for input voltage measurements in the analog to digital converter circuit permits the conversion to take place over a relatively long time period, thereby increasing the resolution of the resulting conversion. Changes in the supply voltage are combined with the input analog signal (during the capacitance charging period) and with the reference voltage (during the capacitance discharge cycle) providing compensation for the effects of time, temperature and the tolerance of the supply voltage.

22 Claims, 2 Drawing Sheets

APPARATUS AND METHOD FOR RANGE CONTROL AND SUPPLY VOLTAGE COMPENSATION IN A DUAL SLOPE ANALOG TO DIGITAL CONVERTER

BACKGROUND OF THE INVENTION

1. Field of the Invention

This invention relates generally to analog to digital converter circuits and, more particularly, to dual slope analog to digital converter circuits. The present invention provides for improved resolution in the conversion process and provides for reduced sensitivity of the conversion process to certain circuit parameters, such as changes in the supply voltage.

2. Description of the Related Art

Referring to FIG. 1, an illustration of one technique for the conversion of an analog input signal to a digital output signal. An input voltage $V_{IN}=V_1$ is applied to the input terminal of an integrator circuit. The charging of the capacitor associated with the integrator circuit provides a linear output voltage VOUT with a slope generally proportional to the magnitude of the input voltage. Thus $V_3 > V_2 > V_1$ as illustrated in FIG. 1. After a time $T_0$, the input voltage is replaced by a zero voltage signal, i.e., $V_{IN}=0$, the capacitor in the integrating circuit will discharge at a rate determined by the circuit parameters. Thus, the charge on the integrator circuit capacitor resulting from application of $V_{IN}=V_1$ for a period $T_0$ will be removed in a time $T_1$, the charge on the integrator circuit capacitor resulting from application of $V_{IN}=V_2$ for a period of $T_0$ will be removed in a time $T_2$ and the charge on the integrator circuit capacitor resulting from the application of $V_{IN}=V_3$ will be removed in a time $T_3$. The quantities $T_1$, $T_2$ and $T_3$ or $T_0+T_1$, $T_0+T_2$ and $T_0+T_3$ define, except for an additive and/or a multiplicative scaling factor, the voltage levels of $V_1$, $V_2$ and $V_3$, respectively.

Referring to FIG. 2, a block diagram of the apparatus for performing the dual slope analog to digital conversion of the prior art is illustrated. The timer unit 24 causes the voltage $V_{IN}$ to be applied to the integrator circuit 21 (the integrator circuit including capacitor C and resistor R). The voltage at the output terminal of integrator circuit 21 begins to fall and causes comparator 23 to change states when $V_{OUT}$ falls below $V_{COMP}$. After a preestablished time, $T_0$, the timer unit 24 causes the ground or common potential to be applied to integrator circuit 21 and the voltage $V_{OUT}$ begins to rise. When the $V_{OUT}$ rises above $V_{COMP}$, the output voltage $V_{OUT}(23)$ of comparator 23 changes state and stores the time which has elapsed since the switch unit 22 initiated the timing procedure. As indicated in FIG. 1, the voltage $V_{OUT}(23)$ will be delayed (generally referred to a hysteresis) until the $V_{OUT}$ is approximately equal $V_{COMP}$.

The prior art involving dual slope analog to digital converter circuits is extensive. U.S. Pat. No. 3,978,471 by Kelly describes a digital thermometer that uses a low precision voltage source and temperature dependent resistive element to provide a temperature dependent voltage for a dual slope analog to digital converter. The variations in the voltage source are compensated for by a plurality of switches that select the voltage to be applied to the analog to digital converter. U.S. Pat. No. 4,364,028 by Masuda et al describes the use of a control circuit to select a correction voltage to a second terminal of an operational amplifier to compensate for the (internally generated) offset voltage. The control circuit selects a position of resistance dividing network to provide the appropriate correction voltage. U.S. Pat. No. 4,379,260 by Labus describes a technique for compensating for instabilities in an analog to digital converter circuit by storing a charge related to the instability on a capacitor and using the stored charge to compensate for the instability. The compensation technique requires a plurality of switches activated at the appropriate time to compensate for the instability. U.S. Pat. No. 4,445,111 by Swift et al describes a dual slope analog to digital converter circuit that uses an accurate reference source and inaccurate reference source. Apparatus is described for comparing the accurate and the inaccurate reference sources and providing a factor for the correction of the inaccurate reference source. U.S. Pat. No. 4,485,372 by Holloway describes apparatus for improving the accuracy of an analog to digital converter circuit by using a first stage including successive approximation apparatus to develop the higher order digital bits and a second stage using a dual slope analog to digital converter to provide the lower order digital bits. Another technique for improving the accuracy of an analog to digital conversion is described by U.S. Pat. No. 4,558,303 by Fielden wherein a first approximation to the digital designation is made by comparison of the input voltage to a series of voltages determined by a precision resistance dividing network and a reference voltage. The values between those provided by the resistance dividing network are determined by a comparison of the input voltage with a ramp voltage generated between the nearest two values of the resistance dividing network. In U.S. Pat. No. 4,596,977, an "out of range" voltage for a dual slope analog to digital converter circuit is detected by a timer which determines that the time for the integration of the input signal, that was anticipated for the selected range, has been exceeded. In U.S. Pat. No. 4,617,550 by Glineman, a dual slope analog to digital converter circuit is described that, when the integration is to exceed a predetermined level (beyond which the circuit components can not operate as desired), a reference voltage of opposite polarity is applied to the integrating portion of the converter circuit to discharge the capacitor a known amount, thereby permitting the converter circuit to provide digital designations for signals that would otherwise be too large to measure. In U.S. Pat. No. 4,633,221 by Bradshaw et al, a technique for providing a plurality of ranges for a dual slope analog to digital converter is described. The technique relies on precision components and charges the capacitor for a known period of time. The capacitor discharges and a measurement is taken. When the measurement of the discharge time is less than a predetermined time, the charging time is increased. The process is repeated until a sufficiently large count indicates that the appropriate range has been reached. In U.S. Pat. No. 4,644,323 by Chamran, another technique for providing a dynamic range adjustment for an unknown input signal for a dual slope analog to digital converter is described. Using this technique, when a input signal causes the integrated charge to exceed a predetermined value in a given period of time, the time period for integration caused by the input signal is shortened by a given amount until the capacitor charge remains less than the predetermined value. A known reference voltage is used to discharge the capacitor and the charging and discharging time are compared to obtain a digital value. U.S. Pat. No. 4,661,803 by Nishiyama describes a technique for compensating for changes in the supply voltage by an initialization procedure in which a charge, related to the supply voltage, is stored on a capacitor prior to the determination of a digital value for an input voltage. The stored charge provides compensation, during the measurement period for changes in the supply voltage.

Therefore, in the prior art, apparatus has been disclosed which can improve the accuracy of the analog to digital converter circuit for both fluctuations in supply voltage and range selection. The apparatus typically involves precision components and/or additional switching apparatus usually involving additional control circuits. A need has therefore been felt for apparatus and an associated method that can compensate for fluctuations in supply voltage and can minimize the requirement for precision components while still providing for a plurality of measurement ranges for input voltages.

FEATURES OF THE INVENTION

It is an object of the present invention to provide an improved analog to digital converter circuit.

It is a feature of the present invention to provide an improved dual slope analog to digital converter circuit.

It is yet another feature of the present invention to provide a dual slope analog to digital converter circuit that can measure signals in a plurality of ranges.

It is still another feature of the present invention to provide a dual slope analog to digital converter that can compensate for changes in a supply voltage.

It is a still further feature of the present invention to provide a dual slope analog to digital converter circuit that permits compensation for departures from equilibrium values for selected voltage levels.

SUMMARY OF THE INVENTION

The aforementioned and other features are accomplished, according to the present invention, by a dual slope analog to digital converter circuit in which the input signal is coupled through two intermediate operational amplifiers before being applied to an operational amplifier integrating component. An intermediate operational amplifier and the operational amplifier integrating component have signals applied thereto that control the range of input signals. These range control and other signals are applied to two circuit components in a manner to compensate for changes in circuit parameters. For example, the effects of fluctuations in the supply voltage can be minimized. The output signal of the operational amplifier integrating circuit is applied to a timer circuit that controls the application of the input signal to the operational amplifier integrating circuit and controls a digital count of timing signals for a measurement cycle. In addition, apparatus is provided to determine when the range setting for the measurement of input voltages is inappropriate.

These and other features of the invention will be understood upon reading of the following description along with the drawings.

DESCRIPTION OF THE PREFERRED EMBODIMENT

1. Detailed Description of the Figures

Figure 3:
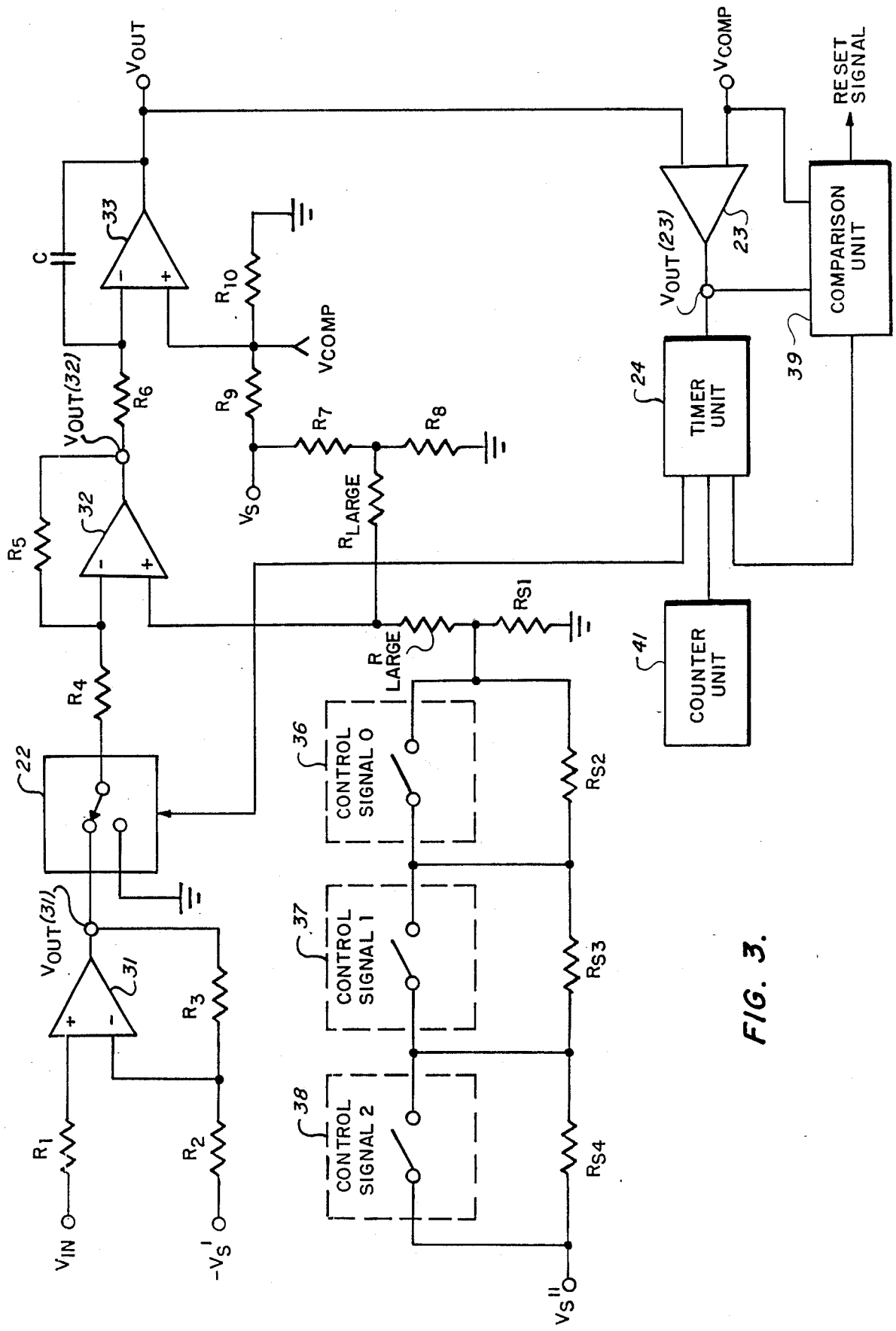
FIG. 3 is a block diagram of the analog to digital converter circuit according to the present invention.

Referring now to FIG. 3, the circuit diagram of the dual slope analog to digital converter according to the present invention is shown. The voltage $V_{IN}$ to be measured is coupled through resistor $R_1$ to a non-inverting input terminal of operational amplifier 31. A negative supply voltage $V_S'$ ($-5$ volts in the preferred embodiment) is coupled through resistor $R_2$ to an inverting input terminal of operational amplifier 31. The negative reference supply insures that the input voltage has an appropriate value with respect to the operational amplifier 31. The output terminal of operational amplifier 31 {having voltage $V_{OUT}(31)$ applied thereto} is coupled through resistor $R_3$ to the inverting input terminal of operational amplifier 31 and is coupled to one input terminal of switch 22. A second input terminal of switch 22 is coupled to the ground or common potential. An output terminal of switch 22 is coupled through resistor $R_4$ to an inverting input terminal of operational amplifier 32. An output terminal of operational amplifier 32 {having voltage $V_{OUT}(32)$ applied thereto} is coupled through resistor $R_5$ to the negative input terminal of operational amplifier 32 and is coupled through resistor $R_6$ to a negative input terminal of operational amplifier 33. The output terminal of operational amplifier 33 is coupled through capacitor C to the negative input terminal of operational amplifier 33, is coupled to the output voltage terminal $V_{OUT}$ and is coupled to a first terminal of operational amplifier 23. A comparison voltage $V_{COMP}$ is applied to a second input terminal of operational amplifier 23 and to a comparison unit 39. An output terminal of operational amplifier 23 is coupled to the comparison unit 39 and to the timer unit 24. The timer unit 24 applies control signals to switch 22 that determines which switch input terminal is coupled to the switch output terminal, applies clock signals to the comparison unit and applies clock signals to counter unit 41. The comparison unit 39 generates a reset signal.

The positive input terminal of operational amplifier 33 is coupled through resistance $R_{10}$ to the common potential, is coupled to comparison voltage $V_{COMP}$, and is coupled to a first terminal of resistor $R_9$. A second terminal of resistor $R_9$ is coupled to a voltage supply terminal $V_S$. $V_S$ is also coupled to a first terminal of resistor $R_7$. A second terminal of resistor $R_7$ is coupled through resistor $R_8$ to the common potential and to a first terminal of resistor $R_{LARGE}$. A second terminal of $R_{LARGE}$ is coupled to a positive terminal of operational amplifier 32 and through a second resistor $R_{LARGE}$ to a first terminal of resistor $R_{S1}$. $R_{S1}$ is coupled to an input terminal of switch 36 and is coupled to a first terminal of resistor $R_{S2}$. A second terminal of resistor $R_{S2}$ is coupled to an output terminal of switch 36, is coupled to an input terminal of switch 37 and is coupled to a first terminal of resistor $R_{S3}$. A second terminal of resistor $R_{S3}$ is coupled to an output terminal of switch 37, is coupled to an input terminal of switch 38 and is coupled to a first terminal of resistor $R_{S4}$. A second terminal of resistor $R_{S4}$ is coupled to an output terminal of switch 38 and is coupled to supply voltage $V_S''$. The switch 37, 38 and 39 receive control signals that determine when the input terminal of a switch is coupled to an output terminal of a switch.

2. Operation of the Preferred Embodiment

Figure 1:
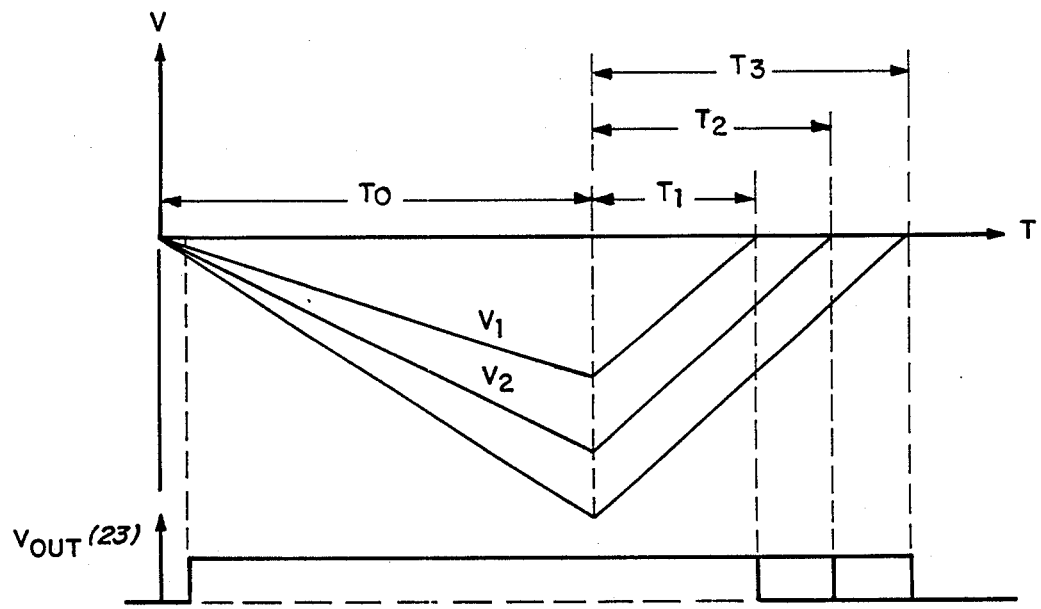
FIG. 1 illustrates the technique used for obtaining a digital signal from an analog signal according to the prior art.
Figure 2:
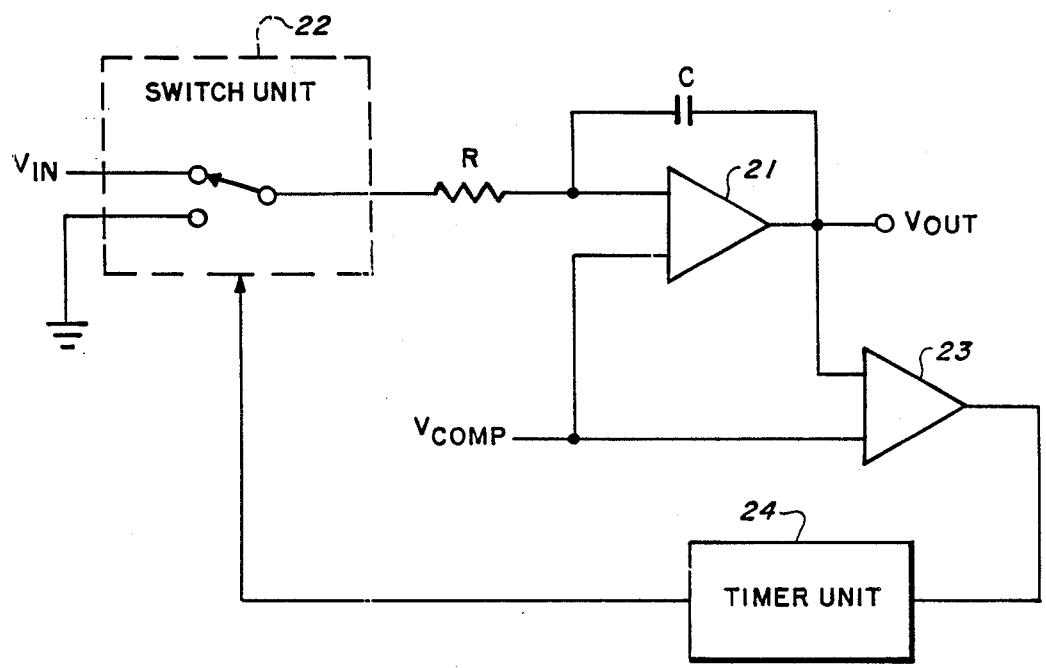
FIG. 2 is a block diagram of an analog to digital converter for implementing the technique analog to digital conversion illustrated in FIG. 1.

The operation of the dual slope analog to digital converter of the present invention can be understood in the following manner. Switch 22 receives a control signal from timer unit 24 which couples the conditioned input voltage $V_{IN}$ to the input terminal of operational amplifier 33 for a preselected period of time. Counter unit 41 is reset and begins counting clock signals from timer unit 24. The component values are selected so that the voltage applied to the inverting input terminal of operational amplifier 33, as a result of this switch position, provides an output signal $V_{OUT}$ which initially declines as shown in FIG. 1. Since $V_{OUT}$ initially started equal to $V_{COMP}$, the declining $V_{OUT}$ causes the output of operational amplifier 23 to switch. After a predetermined time, the timer unit 24 causes the switch position to be changed and the conditioned common or ground potential applied to operational amplifier 33. When a value of $V_{OUT}$ becomes greater than the value of $V_{COMP}$, the output signal of operational amplifier 23 returns to the initial state, the state signals being applied to comparison unit 39 and to timer unit 24. The application of the changed state output signal from operational amplifier 23 freezes the value in the counter unit 41 and permits the measurement process to begin again. Associated with the apparatus of FIG. 3 is typically a microprocessor unit. The microprocessor unit receives the count from the counter unit 36 and provides a digital value for the input signal. The digital value is the result of a calibration procedure using known input voltages. Two known input voltage levels are used to provide two digital quantities in each measurement range. In this manner, compensation is provided for lack of precision in the range control resistors. The digital values for the known input voltages are stored in the microprocessor, the microprocessor thereafter being programmed to extrapolate for the values in the range.

The voltage level applied to the non-inverting terminal of operational amplifier 33 and the voltage level applied to the non-inverting terminal of operational amplifier 32 are chosen, by means of the component values to permit compensation of changes in, for example, the voltage supply $V_S$. Similarly, the range resistors $R_{S2}$, $R_{S3}$ and $R_{S4}$ and switches 36, 37 and 38 are coupled in the compensation circuit to provide range control. (Compensation is not provided for $V_S''$, however, compensation is provided for $V_S$).

As will be clear, the resolution of a measurement will be a function of the voltage magnitude of the voltage to which the capacitor is originally charged. Ideally, the voltage range (of $V_{OUT32}$) should be the maximum value permitted by the parameters of the circuit. As a compromise, ranges are provided in order that the resulting signals can have a substantial digital count. In the preferred embodiment, the range apparatus is denoted $R_{S2}$, $R_{S3}$ and $R_{S4}$ and associated switches 36, 37 and 38. The switches, when closed, provide a short circuit across the associated switch, thereby changing the voltage across $R_{S1}$. The voltage across $R_{S1}$ in combination with the conditioned voltage $V_{IN}(V_{OUT31})$ and the added component of $V_S$ (via $R_{7,8}$), determines the rate of charging of capacitor C and therefore controls the voltage achieved during the constant charging time. $V_{COMP}$ is the initial value of voltage $V_{OUT}$. When the switch 22 is activated to switch in a value of $V_{IN}$ in the proper range, the voltage $V_{OUT}$ begins to decrease and the output voltage of comparator 23 changes state. When, during the second portion of the cycle, the voltage $V_{OUT}$ is increasing, the output of the comparator will change state when the $V_{OUT}$ reaches the initial voltage level $V_{COMP}$. When the voltage $V_{IN}$ is too large, $V_{OUT}$ will not fall below the voltage $V_{COMP}$ (or will fall below $V_{COMP}$ only after an extended period of time). To identify this out of range condition, comparison unit 39 receives the $V_{COMP}$ signal, the output signal from comparator 23 and a signal from a timing unit. The comparison unit determines, after a preestablished period of time, if application of the $V_{IN}$ signal to the integrator unit 33 has taken place. If the change of state has not taken place, then a RESET signal is generated, indicating an out of range input signal. The RESET signal is transmitted to the microprocessor unit (not shown) for appropriate response, i.e., send an appropriate control signal to the range switches 36, 37 or 38. An out of range signal that is too small will display an inappropriate digital result. An inappropriate result can be identified by the microprocessor controller and a response initiated.

The foregoing description is included to illustrate the operation of the preferred embodiment and is not meant to limit the scope of the invention. The scope of the invention is to be limited only by the following claims. From the foregoing description, many variations will be apparent to those skilled in the art that would yet be encompassed by the spirit and scope of the invention.

What is claimed is:

1. A dual slope analog to digital converter circuit comprising:
    a first operational amplifier with a capacitor coupled thereto configured as an integrating circuit;
    a second operational amplifier having an output terminal coupled to an inverting input terminal of said first operational amplifier;
    a switch responsive to control signals for coupling a known voltage to an inverting terminal of said second operational amplifier when said switch is in a first state, said switch coupling an analog voltage to said inverting terminal of said second operational amplifier when said switch is in a second state; and
    resistor network means for applying a reference signal to a non-inverting terminal of said first operational amplifier, said resistor network means applying a predetermined portion of a reference signal applied to a non-inverting terminal of said first operational amplifier to a non-inverting input terminal of said second operational amplifier.

2. The dual slope analog to digital converter circuit of claim 1 wherein parameters of said second operational amplifier are selected to provide for a compensation of said reference signal by said predetermined portion of said reference signal.

3. The dual slope analog to digital converter circuit of claim 2 wherein a supply voltage is applied to said resistor network means.

4. The dual slope analog to digital converter circuit of claim 2 further comprising an input voltage range selection means, said range selection means being coupled to said resistor network means.

5. The dual slope analog to digital converter circuit of claim 4 further comprising:

timing means coupled to said output terminal of said first operational amplifier, said timing means measuring at least a portion of charging and discharging times for said capacitor.

6. The dual slope analog to digital converter circuit of claim 5 wherein said timing means includes a comparison circuit for comparing an output voltage applied to said first operational amplifier output circuit with a comparison voltage.

7. The dual slope analog to digital converter circuit of claim 6 further comprising:
a third operational amplifier with an output terminal coupled to said switch, said third operational amplifier having a non-inverting input terminal coupled to said input signal, said third operational amplifier having an inverting terminal coupled to a voltage source.

8. The dual slope analog to digital converter circuit of claim 5 wherein said range selection means includes a plurality of resistors coupled in series, each of said plurality of resistors having a switch coupled in parallel.

9. The dual slope analog to digital converter circuit of claim 5 further including calibration means for calibrating said timing means in each of input voltage range selection means.

10. The dual slope analog to digital converter circuit of claim 5 wherein said timing means includes apparatus for determining when said first amplifier output voltage is not within an appropriate range.

11. The method of converting an analog signal to a digital quantity, the method comprising the steps of:
applying said analog signal to a first terminal of a first operational amplifier configured as an integrator for a predetermined period of time;
applying a known signal to said first terminal of said first operational amplifier;
applying a portion of a reference voltage to a second terminal of said first operational amplifier;
applying an output signal from said first operational amplifier to a first terminal of a second operational amplifier;
applying said reference voltage to a second terminal of said second operational amplifier; and
applying an output signal from said second operational amplifier to a timer means, wherein said known signal is applied to said first amplifier until said second operational amplifier output signal reaches a predetermined value and an output signal of said timer means provides said digital quantity representative of said analog signal.

12. The method for analog to digital signal conversion of claim 11 further comprising the step of:
selecting component parameters associated with said first and said second operational amplifiers to compensate for changes in said reference voltage by said reference voltage portion.

13. The method for analog to digital signal conversion of claim 12 further comprising the step of selecting said reference voltage to be a function of a supply voltage.

14. The method for analog to digital signal conversion of claim 12 further comprising the step of:
providing range selection apparatus to select from a plurality of conversion ranges.

15. The method for analog to digital signal conversion of claim 14 further comprising the step of:
selecting said reference voltage to be a function of said range apparatus.

16. The method for analog to digital signal conversion of claim 12 further comprising the step of monitoring said second operational amplifier output signal to determine when said analog signal is in a correct range.

17. The method for analog to digital conversion of claim 11 further comprising the step of;
calibrating said conversion by a first and a second preselected voltage level in each input voltage range.

18. An analog to digital converter circuit comprising:
an integrating circuit having a reference signal applied to a first terminal thereof;
an operational amplifier having a output terminal coupled to a second input terminal of said integrating circuit, said operational amplifier having a reference signal portion coupled to a first input terminal;
a switch responsive to control signals for selectively applying a input signal and a known signal to a second terminal of said operational amplifier;
timer means coupled to an output terminal of said integrating circuit for providing a count related to a time said input voltage was applied to said operational amplifier first terminal, said timer means providing control signal to said switch.

19. The analog to digital converter circuit of claim 18 further comprising:
range means for measuring input signals having selected magnitude ranges.

20. The analog to digital converter circuit of claim 19 wherein components associated with said operational amplifier and said integrating circuit are selected so that said reference signal portion compensates for said reference signal.

21. The analog to digital converter circuit of claim 19 further comprising calibration means for calibrating said range means.

22. The analog to digital converter circuit of claim 18 further comprising:
a second operational amplifier, said second operational amplifier having an output terminal coupled to said switch and a first input terminal coupled to said input signal, a second input terminal of said second operational amplifier coupled to a second supply voltage.

* * * * *